(12) United States Patent
Lee et al.

(10) Patent No.: US 12,424,511 B2
(45) Date of Patent: Sep. 23, 2025

(54) HIGH EFFICIENCY HEAT DISSIPATION USING DISCRETE THERMAL INTERFACE MATERIAL FILMS

(71) Applicant: Taiwan Semiconductor Manufacturing Co., Ltd., Hsinchu (TW)

(72) Inventors: Yu Chen Lee, Hsinchu (TW); Shu-Shen Yeh, Taoyuan (TW); Chia-Kuei Hsu, Hsinchu (TW); Po-Yao Lin, Zhudong Township (TW); Shin-Puu Jeng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/360,484

(22) Filed: Jul. 27, 2023

(65) Prior Publication Data

US 2023/0369164 A1    Nov. 16, 2023

Related U.S. Application Data

(62) Division of application No. 17/370,591, filed on Jul. 8, 2021.

(Continued)

(51) Int. Cl.
*H01L 21/48*    (2006.01)
*H01L 23/00*    (2006.01)
(Continued)

(52) U.S. Cl.
CPC ...... *H01L 23/3735* (2013.01); *H01L 23/3128* (2013.01); *H01L 23/3675* (2013.01);
(Continued)

(58) Field of Classification Search
CPC .......................... H01L 21/4882; H01L 25/50
See application file for complete search history.

(56) References Cited

U.S. PATENT DOCUMENTS 8,993,380 B2    3/2015  Hou et al.
9,281,254 B2    3/2016  Yu et al.
(Continued)

FOREIGN PATENT DOCUMENTS

KR    20200020632 A       2/2020
WO    WO-2019161282 A1 *  8/2019

*Primary Examiner* — Michele Fan
(74) *Attorney, Agent, or Firm* — Slater Matsil, LLP

(57) ABSTRACT

A semiconductor structure includes: a substrate; a package attached to a first surface of the substrate, where the package includes: an interposer, where a first side of the interposer is bonded to the first surface of the substrate through first conductive bumps; dies attached to a second side of the interposer opposing the first side; and a molding material on the second side of the interposer around the dies; a plurality of thermal interface material (TIM) films on a first surface of the package distal from the substrate, where each of the TIM films is disposed directly over at least one respective die of the dies; and a heat-dissipation lid attached to the first surface of the substrate, where the package and the plurality of TIM films are disposed in an enclosed space between the heat-dissipation lid and the substrate, where the heat-dissipation lid contacts the plurality of TIM films.

20 Claims, 17 Drawing Sheets

Related U.S. Application Data

(60) Provisional application No. 63/193,855, filed on May 27, 2021.

(51) Int. Cl.
*H01L 23/31* (2006.01)
*H01L 23/367* (2006.01)
*H01L 23/373* (2006.01)
*H01L 23/498* (2006.01)
*H01L 25/065* (2023.01)

(52) U.S. Cl.
CPC .. *H01L 23/49816* (2013.01); *H01L 23/49822* (2013.01); *H01L 23/49833* (2013.01); *H01L 23/49838* (2013.01); *H01L 24/16* (2013.01); *H01L 24/73* (2013.01); *H01L 25/0655* (2013.01); *H01L 2224/16227* (2013.01); *H01L 2224/16238* (2013.01); *H01L 2224/73204* (2013.01); *H01L 2924/16251* (2013.01); *H01L 2924/182* (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 11,610,854 B2 | 3/2023 | Tsai et al. |
| 2005/0256241 A1 | 11/2005 | Sachdev et al. |
| 2007/0212812 A1* | 9/2007 | Chow ................. H01L 21/6836 257/E23.09 |
| 2007/0219312 A1* | 9/2007 | David .................... C09J 183/04 524/588 |
| 2009/0068441 A1* | 3/2009 | Swaroop ................. C08K 3/01 252/75 |
| 2010/0181665 A1* | 7/2010 | Casey .................. H01L 23/433 257/723 |
| 2014/0138854 A1 | 5/2014 | Arora |
| 2014/0264820 A1 | 9/2014 | Hu et al. |
| 2015/0123259 A1* | 5/2015 | Nakamura .......... H01L 21/4871 257/713 |
| 2018/0374776 A1* | 12/2018 | Liu ..................... H01L 23/3737 |
| 2019/0385929 A1 | 12/2019 | Ku et al. |
| 2020/0219786 A1* | 7/2020 | Hung .................. H01L 21/4853 |
| 2020/0286809 A1* | 9/2020 | Gong .................. H01L 23/3737 |
| 2021/0035884 A1 | 2/2021 | Yeh et al. |

* cited by examiner

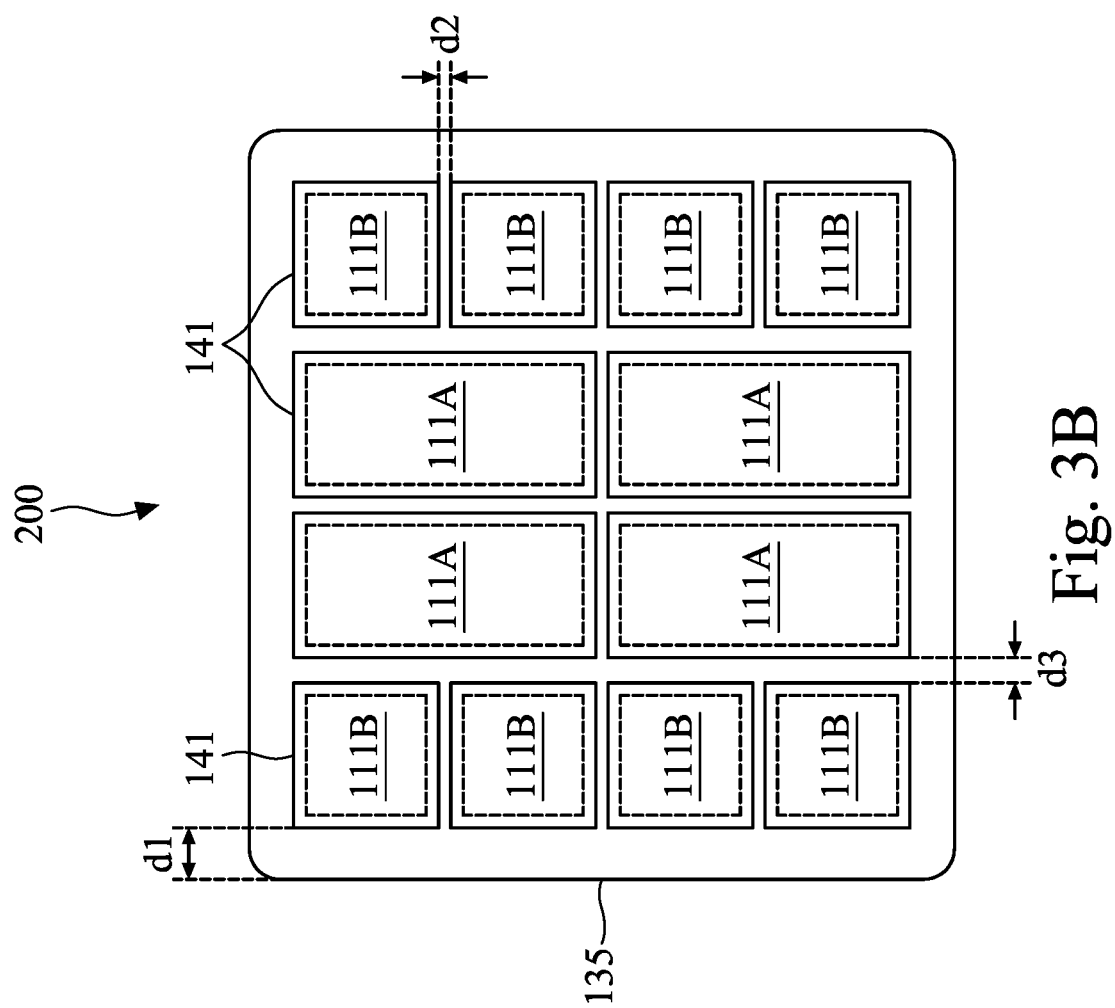

HIGH EFFICIENCY HEAT DISSIPATION USING DISCRETE THERMAL INTERFACE MATERIAL FILMS

PRIORITY CLAIM AND CROSS-REFERENCE

This application is a divisional of U.S. patent application Ser. No. 17/370,591, filed Jul. 8, 2021 and entitled "High Efficiency Heat Dissipation Using Discrete Thermal Interface Material Films," which claims priority to U.S. Provisional Patent Application No. 63/193,855, filed May 27, 2021 and entitled "Discrete Film-Type TIM Pattern for Improved Coverage in Package," which applications are hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. Another example is a Chip-on-Wafer-on-Substrate (CoWoS) structure, where a semiconductor chip is attached to a wafer (e.g., an interposer) to form a Chip-on-Wafer (CoW) structure. The CoW structure is then attached to a substrate (e.g., a printed circuit board) to form a CoWoS structure. These and other advanced packaging technologies enable production of semiconductor devices with enhanced functionalities and small footprints.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, and 4-6 illustrate various views of a semiconductor device at various stages of fabrication, in accordance with an embodiment.

DETAILED DESCRIPTION

Figure 1A:
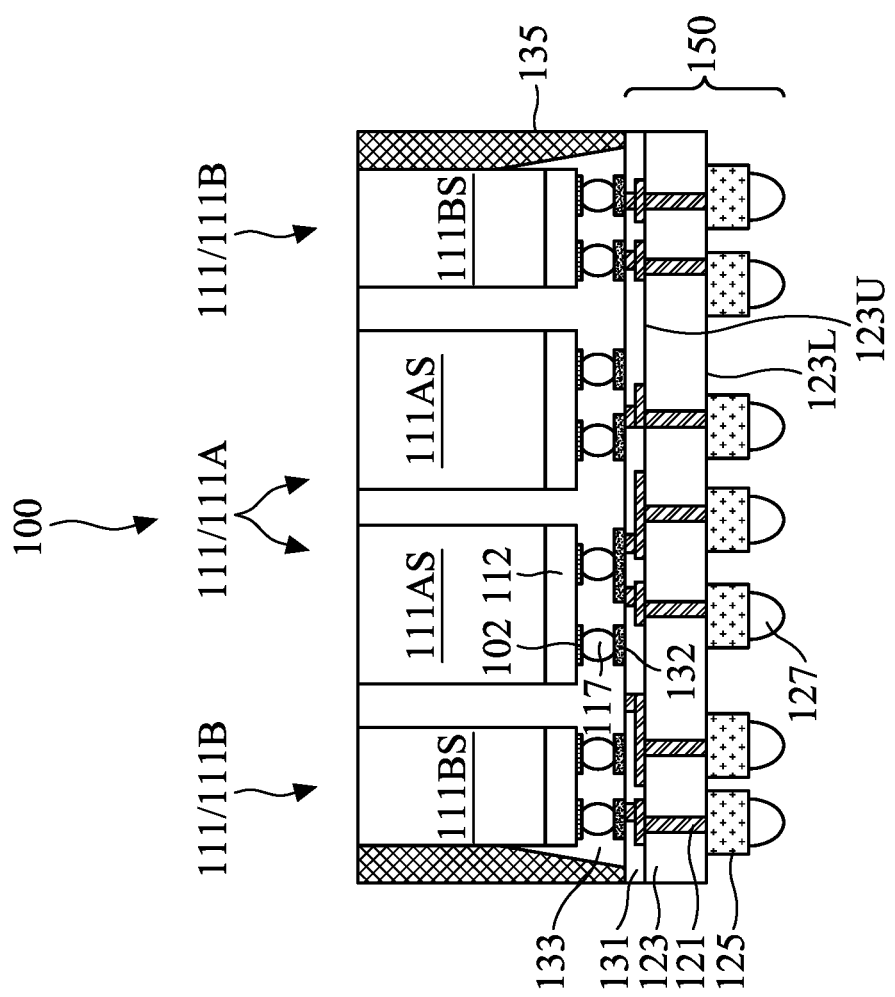
FIG. 1A illustrates a cross-sectional view of a semiconductor device, in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. Throughout the description, unless otherwise specified, like reference numerals in difference figures refer to the same or similar component formed by a same or similar method using a same or similar material(s). Furthermore, figures with the same numeral but different alphabets (e.g., FIGS. 3A and 3B) illustrate various views (e.g., cross-sectional view, top view) of the same structure at the same stage of the fabrication process.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed herein in the context of forming a Chip-on-Wafer-on-Substrate (CoWoS) structure with a thermal interface material (TIM) film. The principle of the present disclosure may be applied to other structures or devices, such as Integrated Fan-Out (InFO) packages, or System-on-Integrated Circuit (SoIC) packages.

In some embodiments, a Chip-on-Wafer (CoW) structure, which includes a plurality of dies bonded to an interposer and a molding material around the dies, is attached to a substrate to form a Chip-on-Wafer-on-Substrate (CoWoS) structure. Next, a plurality of pre-made, sheet-type TIM films are laminated on the dies, where each of the TIM film is directly over at least one of the dies, and the TIM films are laterally spaced apart from each other. Next, a heat-dissipation lid is attached to the substrate over the CoW structure and the TIM films, where the TIM films contact the lid and the dies. By using multiple, smaller, TIM films over the dies instead of a single, larger, TIM film over all of the dies, the possibility of TIM film delamination in the peripheral regions of the CoW structure is avoided or reduced, which improves the heat dissipation efficiency, reduces the stress in the package, and improves the structural integrity of the device formed.

FIG. 1A illustrates a cross-sectional view of a semiconductor device 100, in accordance with an embodiment. The semiconductor device 100 has a Chip-on-Wafer (CoW) structure. As illustrated in FIG. 1A, the semiconductor device 100 includes a wafer 150 (e.g., an interposer), one or more dies 111 (e.g., 111A and 111B) attached to the wafer 150, an underfill material 133 between the dies 111 and the wafer 150, and a molding material 135 over the wafer 150 and around the dies 111. The semiconductor device 100 is subsequently attached to a substrate to form a semiconductor device 200 having a Chip-on-Wafer-on-Substrate (CoWoS) structure, details of which are described hereinafter.

To form the semiconductor device 100, one or more dies 111 (may also be referred to as semiconductor dies, chips, or integrated circuit (IC) dies) are attached to an upper surface of the wafer 150. In the illustrated embodiment, the wafer 150 is an interposer, and therefore, the wafer 150 may also be referred to as an interposer in the discussion herein, with the understanding that other types of suitable wafers may also be used as the wafer 150. The dies 111 (e.g., 111A and 111B) are a same type of dies (e.g., memory dies, or logic dies), in some embodiments. In other embodiments, the dies 111 are of different types, e.g., the dies 111A may be logic dies and the dies 111B may be memory dies. The number of dies 111 and the relative locations of the dies 111 in FIG. 1A are merely examples, other numbers and other locations of the dies are possible and are fully intended to be included within the scope of the present disclosure.

In some embodiments, the die 111A includes a substrate 111AS, electrical components (e.g., transistors, resistors, capacitors, diodes, or the like) formed in/on the substrate 111AS, and an interconnect structure 112 over the substrate 111AS connecting the electrical components to form functional circuits of the die 111A. The die 111A also includes conductive pads 102 and conductive pillars 117 (also referred to as die connectors) formed on the conductive pads 102. The conductive pillars 117 provide electrical connection to the circuits of the die 111A.

The substrate 111AS of the die 111A may be a semiconductor substrate, doped or undoped, or an active layer of a silicon-on-insulator (SOI) substrate. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates that may be used include multi-layered substrates, gradient substrates, or hybrid orientation substrates. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The electrical components of the die 111A comprise a wide variety of active components (e.g., transistors) and passive components (e.g., capacitors, resistors, inductors), and the like. The electrical components of the die 111A may be formed using any suitable methods either within or on the substrate 111AS of the die 111A. The interconnect structure 112 of the die 111A comprises one or more metallization layers (e.g., copper layers) formed in one or more dielectric layers, and is used to connect the various electrical components to form functional circuitry. In an embodiment, the interconnect structure is formed of alternating layers of dielectric and conductive material (e.g., copper) and may be formed through any suitable process (e.g., deposition, damascene, dual damascene).

One or more passivation layers (not shown) may be formed over the interconnect structure 112 of the die 111A in order to provide a degree of protection for the underlying structures of the die 111A. The passivation layer may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer may be formed through a process such as chemical vapor deposition (CVD), although any suitable process may be utilized.

Conductive pads 102 may be formed over the passivation layer and may extend through the passivation layer to be in electrical contact with the interconnect structure 112 of the die 111A. The conductive pads 102 may comprise aluminum, but other materials, such as copper, may be used.

Conductive pillars 117 of the die 111A are formed on the conductive pads 102 to provide conductive regions for electrical connection to the circuits of the die 111A. The conductive pillars 117 may be copper pillars, contact bumps such as microbumps, or the like, and may comprise a material such as copper, tin, silver, combinations thereof, or other suitable material.

The dies 111B are formed using the same or similar processing steps, although different electrical components and different electrical connections may be formed such that circuits with different functions are formed for the different dies. Details are not repeated here.

Looking at the wafer 150, which includes a substrate 123, through vias 121 (also referred to as through-substrate vias (TSVs)), a redistribution structure 131, conductive pads 132 at an upper surface of the wafer 150, and external connectors 125 (may also be referred to as conductive bumps) at a lower surface of the wafer 150. The structure of the wafer 150 in FIG. 1A is merely a non-limiting example. Other structures are possible and are fully intended to be included within the scope of the present disclosure.

The substrate 123 may be, e.g., a silicon substrate, doped or undoped, or an active layer of a silicon-on-insulator (SOI) substrate. However, the substrate 123 may also be a glass substrate, a ceramic substrate, a polymer substrate, or any other substrate that may provide a suitable protection and/or interconnection functionality.

In some embodiments, the substrate 123 may include electrical components, such as resistors, capacitors, signal distribution circuitry, combinations of these, or the like. These electrical components may be active, passive, or a combination thereof. In other embodiments, the substrate 123 is free from both active and passive electrical components therein. All such combinations are fully intended to be included within the scope of this disclosure.

Through vias 121 are formed in the substrate 123 and extend from an upper surface 123U of the substrate 123 to a lower surface 123L of the substrate 123. The through vias 121 provide electrical connections between the conductive pads 132 and the external connectors 125. The through vias 121 may be formed of a suitable conductive material such as copper, tungsten, aluminum, alloys, doped polysilicon, combinations thereof, and the like. A barrier layer may be formed between the through vias 121 and the substrate 123. The barrier layer may comprise a suitable material such as titanium nitride, although other materials, such as tantalum nitride, titanium, or the like, may be utilized.

Once the through vias 121 have been formed, the redistribution structure 131 may be formed on the upper surface 123U of the substrate 123 in order to provide interconnectivity between the through vias 121, the external connectors 125, and the dies 111A and 111B. The redistribution structure 131 comprises electrically conductive features (conductive lines and/or vias) disposed in one or more dielectric layers of the redistribution structure 131. In some embodiments, the one or more dielectric layers are formed of a polymer, such as polybenzoxazole (PBO), polyimide, benzocyclobutene (BCB), or the like. In other embodiments, the dielectric layer is formed of a nitride such as silicon nitride; an oxide such as silicon oxide, phosphosilicate glass (PSG), borosilicate glass (BSG), boron-doped phosphosilicate glass (BPSG), or the like; or the like. The one or more dielectric layers of the redistribution structure 131 may be formed by any acceptable deposition process, such as spin coating, chemical vapor deposition (CVD), laminating, combination thereof, or the like.

In some embodiments, the conductive features of the redistribution structure 131 comprise conductive lines and/or conductive via formed of a suitable conductive material such as copper, titanium, tungsten, aluminum, or the like. The conductive features may be formed by, e.g., forming openings in a dielectric layer of the redistribution structure to expose underlying conductive features, forming a seed layer over the dielectric layer and in the openings, forming a patterned photoresist with a designed pattern over the seed layer, plating (e.g., electroplating or electroless plating) the conductive material in the designed pattern and over the seed layer, and removing the photoresist and portions of seed layer on which the conductive material is not formed. After the redistribution structure 131 is formed, the conductive pads 132 may be formed over and electrically coupled to the redistribution structure 131 using any suitable material such as copper, aluminum, gold, tungsten, combinations thereof, or the like.

Next, the external connectors 125 are formed on the lower surface 123L of the substrate 123. The external connectors 125 may be any suitable type of external contacts, such as microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb layer, combinations thereof, or the like.

As illustrated in FIG. 1A, the conductive pillar 117 of the dies 111 are bonded to the conductive pads 132 of the wafer 150 by, e.g., solder regions. A reflow process may be performed to bond the dies 111 to the wafer 150.

After the dies 111 are bonded to the wafer 150, an underfill material 133 is formed between the dies 111 and the wafer 150. The underfill material 133 may, for example, comprise a liquid epoxy that is dispensed in a gap between the dies 111 and the wafer 150, e.g., using a dispensing needle or other suitable dispensing tool, and then cured to harden. As illustrated in FIG. 1A, the underfill material 133 fills the gap between the dies 111 and the wafer 150, and may also fill gaps between sidewalls of the dies 111.

Next, a molding material 135 is formed over the wafer 150 and around the dies 111. The molding material 135 also surrounds the underfill material 133. The molding material 135 may comprise an epoxy, an organic polymer, a polymer with or without a silica-based filler or glass filler added, or other materials, as examples. In some embodiments, the molding material 135 comprises a liquid molding compound (LMC) that is a gel-type liquid when applied. The molding material 135 may also comprise a liquid or solid when applied. In some embodiments, the molding material 135 may comprise other insulating and/or encapsulating materials. The molding material 135 is applied using a wafer level molding process in some embodiments. The molding material 135 may be molded using, for example, compressive molding, transfer molding, molded underfill (MUF), or other methods.

Next, the molding material 135 is cured using a curing process, in some embodiments. The curing process may comprise heating the molding material 135 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. In some embodiments, the molding material 135 may be cured using other methods. In some embodiments, a curing process is not included.

After the molding material 135 is formed, a planarization process, such as chemical and mechanical planarization (CMP), may be performed to remove excess portions of the molding material 135 from over the dies 111, such that the molding material 135 and the dies 111 have a coplanar upper surface. As illustrated in FIG. 1A, the molding material 135 is conterminous with the substrate 123 of the wafer 150, such that sidewalls of the molding material 135 are vertically aligned with respective sidewalls of the wafer 150.

Figure 1B:
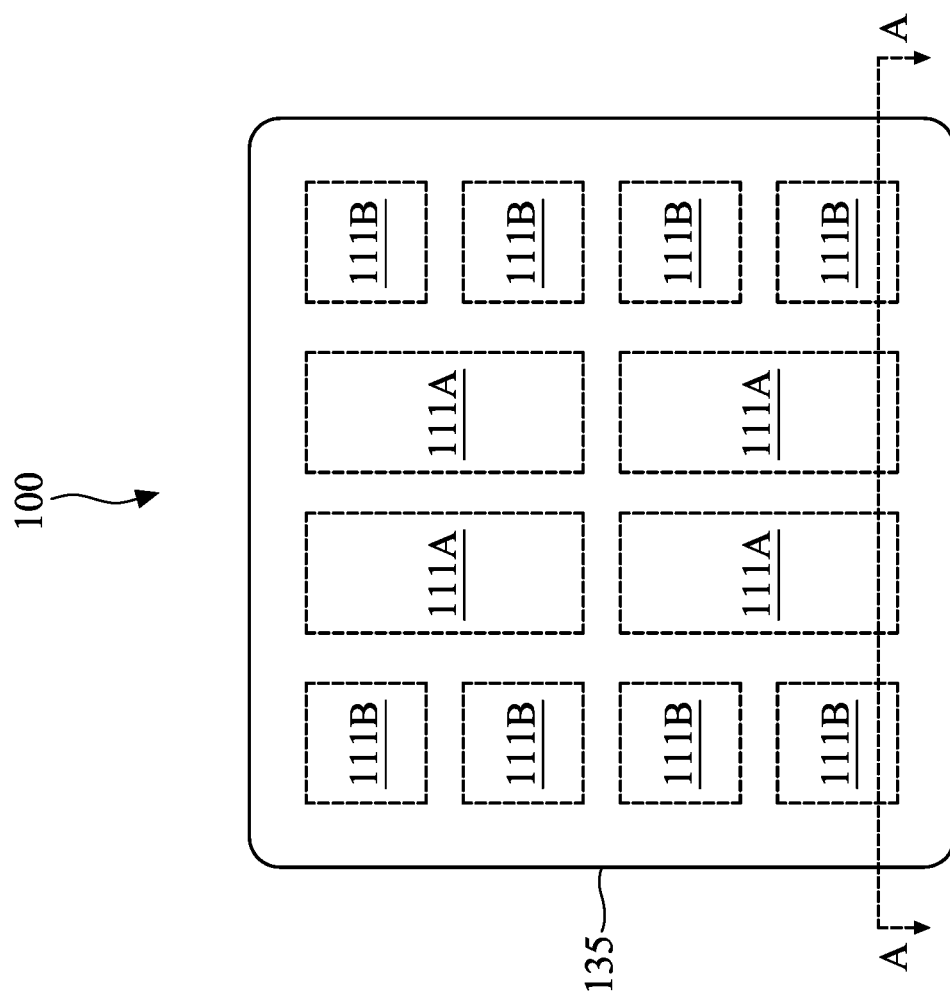
FIG. 1B illustrates a top view of the semiconductor device of FIG. 1A, in accordance with an embodiment.

FIG. 1B illustrates a top view of the semiconductor device 100 of FIG. 1A, in an embodiment. FIG. 1A illustrates the cross-sectional view of the semiconductor device 100 along cross-section A-A in FIG. 1B. For simplicity, not all features are illustrated in FIG. 1B. For example, the underfill material 133 is not illustrated in FIG. 1B. As illustrated in the top view of FIG. 1B, the dies 111A are positioned in a center region of the semiconductor device 100. A plurality of dies 111B, which are smaller than the dies 111A, are positioned in peripheral regions of the semiconductor device 100 on opposing sides of the dies 111A. FIG. 1B also illustrates the molding material 135 around the dies 111A and 111B.

Figure 2:
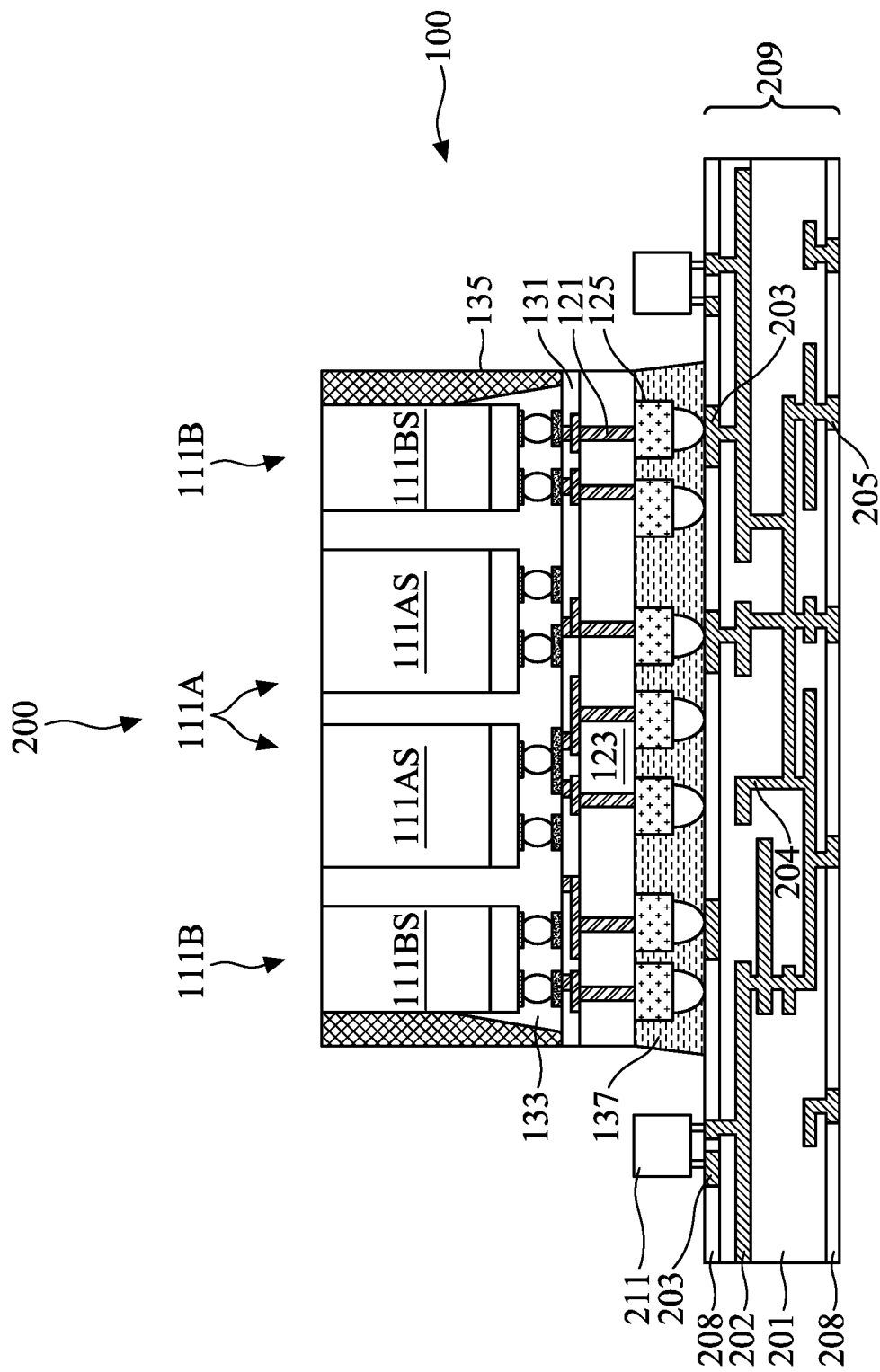

FIGS. 2, 3A, 3B, and 4-6 illustrate various views of a semiconductor device 200 at various stages of fabrication, in accordance with an embodiment. As illustrated in FIG. 2, the semiconductor device 100 of FIG. 1A is bonded to an upper surface of a substrate 209 (e.g., a printed circuit board) to form the semiconductor device 200, which has a Chip-on-Wafer-on-Substrate (CoWoS) structure. FIG. 2 also illustrates passive components 211 attached to the upper surface of the substrate 209.

In some embodiments, the substrate 209 is a multiple-layer circuit board such as a printed circuit board (PCB). For example, the substrate 209 may include one or more dielectric layers 201 formed of bismaleimide triazine (BT) resin, FR-4 (a composite material composed of woven fiberglass cloth with an epoxy resin binder that is flame resistant), ceramic, glass, plastic, tape, film, or other supporting materials. The substrate 209 may include electrically conductive features (e.g., conductive lines 202 and vias 204) formed in/on the substrate 209. As illustrated in FIG. 2, solder resist layers 208 are formed on the upper and lower surfaces of the substrate 209. In addition, the substrate 209 has conductive pads 203 formed on the upper surface of the substrate 209, and conductive pads 205 formed on the lower surface of the substrate 209, which conductive pads 203 and 205 are electrically coupled to the conductive features of the substrate 209.

In FIG. 2, the semiconductor device 100 is bonded to the conductive pads 203 of the substrate 209. A reflow process may be performed to electrically and mechanically couple the external connectors 125 of the semiconductor device 100 to the conductive pads 203 of the substrate 209. An underfill material 137 is formed to fill the gap between the semiconductor device 100 and the substrate 209. The underfill material 137 may be same as or similar to the underfill material 133, thus details are not repeated here.

FIG. 2 also illustrates passive components 211 attached to the upper surface of the substrate 209 adjacent to the semiconductor device 100. The passive components 211 may be, e.g., discrete components such as capacitors, inductors, resistors, or the like. Contact terminals of the passive components 211 are bonded to the conductive pads 203. The passive components 211 are attached to the substrate 209 before the semiconductor device 100 is attached to the substrate 209, in some embodiments. In other embodiments, the passive components 211 are attached to the substrate 209 after the semiconductor device 100 is attached to the substrate 209.

Figure 3A:
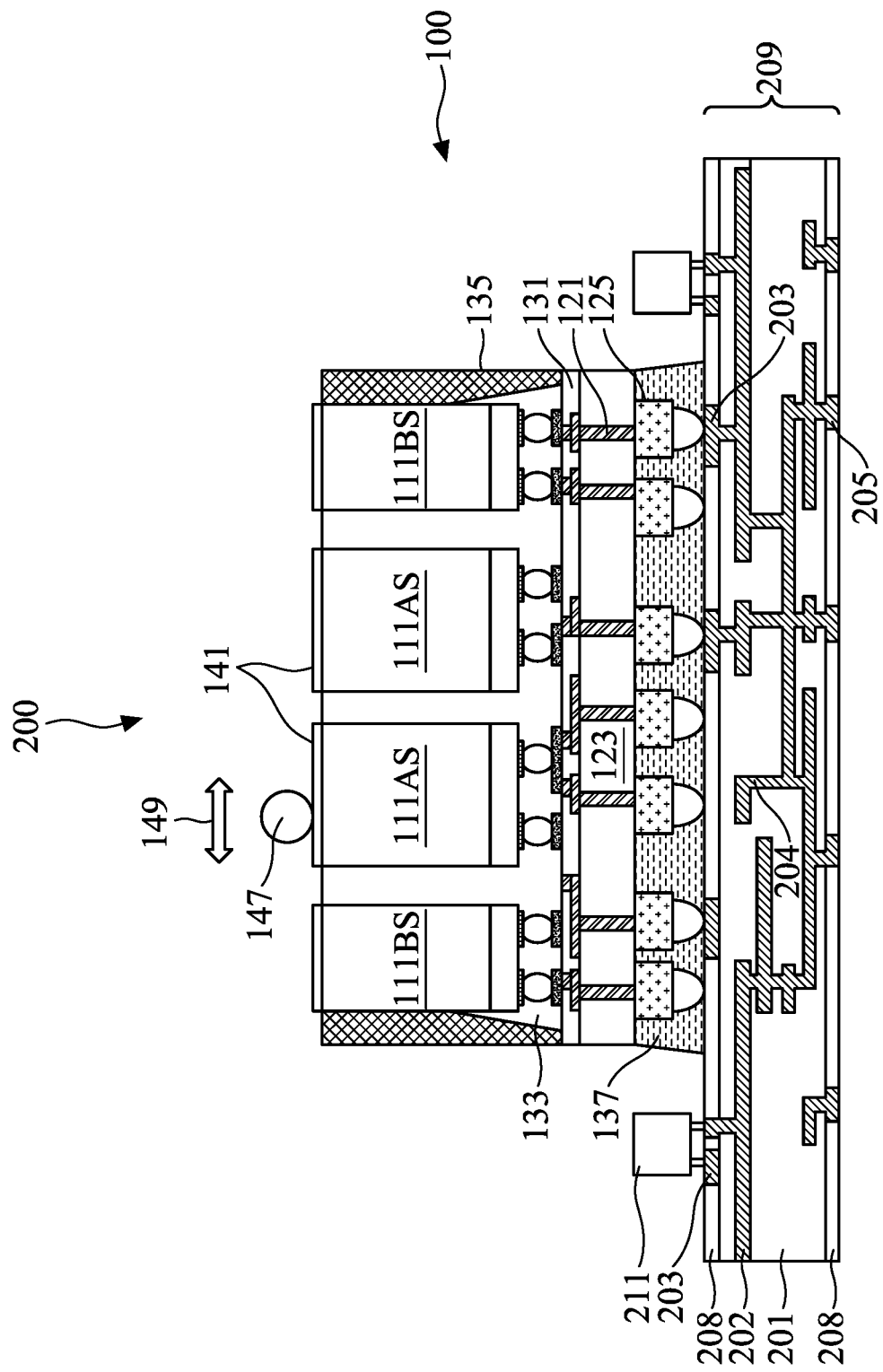

Next, referring to FIG. 3A, a plurality of thermal interface material (TIM) films 141 are placed (e.g., laminated) on the upper surfaces of the dies 111. The TIM films 141 are pre-made before being placed on the dies 111. For example, each of the TIM films 141 is pre-made as a sheet (e.g., in a sheet format like a piece of paper) before being placed on the die 111. Therefore, the TIM film 141 is also referred to as a sheet-type TIM film.

The TIM film 141 is formed of a suitable material with high thermal conductivity. For example, the TIM film 141 may be a graphene film. A thickness of the TIM film 141 may be in a range between about 0.1 mm and about 0.2 mm, as an example. In some embodiments, the thermal conductivity of the TIM film 141 is between about 10 watts per meter-kelvin (W/(m·K)) and about 15 W/(m·K). Note that although the TIM film 141 is illustrated as a single layer in the figures, the TIM film 141 may include multiple sublayers laminated together. In some embodiments, a plurality of the TIM film 141 may be stacked together over the dies 111 to achieve a desired total thickness.

In some embodiments, the TIM film 141 is formed of a dielectric material that is a mixture of carbon and a polymer, where the polymer may be, e.g., a resin-based polymer or an acrylic-based polymer. In some embodiments, a weight percentage of carbon in the material of the TIM film 141 is between about 40% and about 90%. In some embodiments, the thermal conductivity of the TIM film 141 comprising carbon and polymer is between about 20 W/(m·K) and about 80 W/(m·K), such as 23 W/(m·K). The range of the above disclosed weight percentage of carbon may be adjusted according to the physical properties of the TIM film 141 and performance requirements. For example, if the carbon percentage is below about 40%, then the thermal conductivity of the TIM film 141 may be too low. Conversely, if the carbon percentage is above about 90%, then the elasticity and/or viscosity of the TIM film 141 may be too low.

Still referring to FIG. 3A, after the TIM films 141 are placed on the dies 111, the TIM films 141 are pressed against the upper surfaces of the dies 111 by rolling a roller 147 on the TIM films 141, e.g., along the directions of the arrow 149 in FIG. 3A. The pressing of the roller 147 ensures that the TIM films 141 are in firm contact with the upper surfaces of the dies 111, such that there is no gap (e.g., air bubble) between the TIM films 141 and the upper surfaces of the dies 111. This ensures that the contact areas between the TIM films 141 and the dies 111 are maximized, which improves the efficiency of heat transfer (e.g., heat dissipation) from the dies 111 to the TIM films 141. In some embodiments, the step of pressing the TIM films 141 with the roller 147 is omitted.

FIG. 3B illustrates the top view of the semiconductor device 200 of FIG. 3A. Note that for simplicity, not all features of the semiconductor device 200 are illustrated. For example, the substrate 209 and the passive components 211 are not illustrated. In FIG. 3B, the dies 111 (e.g., 111A and 111B) are shown in phantom, and the molding material 135 surrounds the dies 111. In the example of FIG. 3B, each of the TIM films 141 completely covers the upper surface of an underlying die 111 (e.g., 111A or 111B). In other words, in the example of FIG. 3B, the number of TIM films 141 is equal to the number of dies 111, and each TIM film 141 is directly over (e.g., directly over and physically contacts) a respective die 111.

In the illustrated example of FIG. 3B, each of the TIM films 141 has a same shape (e.g., rectangle, or square) as the underlying die 111, and the dimension (e.g., width and height) of each TIM film 141 is larger than that of the underlying die 111, such that the TIM film 141 extends beyond boundaries (e.g., sidewalls) of the underlying die 111 and contacts the molding material 135 (and/or the underfill material 133). In other embodiments, the dimension of each TIM film 141 is the same as the underlying die 111, such that in the top view, boundaries (e.g., sidewalls) of the TIM film 141 completely overlap with (e.g., are the same as) the boundaries of the underlying die 111. Therefore, in the example of FIG. 3B, each of the TIM film 141 has a geometric similar shape as the underlying die 111. Note that the term "geometric similar" is used to include both embodiments where the shape of the TIM film 141 and the shape of the underlying die 111 are the same and have the same dimension, and the embodiment where the shape of the TIM film 141 is a scaled (e.g., enlarged) version of the shape of the underlying die 111. The drawings for the various embodiments in the present disclosure show each of the TIM films 141 as having a larger dimension than the underlying die 111, with the understanding that the TIM film 141 may have a same dimension as the underlying die 111 in some embodiments.

Still referring to FIG. 3B, the TIM films 141 are separated (e.g., spaced apart) from each other. For example, FIG. 3B illustrates gaps having dimensions d2 or d3 between adjacent TIM films 141, where d2 and d3 are larger than zero. FIG. 3B also illustrates a distance d1 between boundaries (e.g., sidewalls) of the molding material 135 and the corresponding boundaries (e.g., sidewalls) of the TIM film 141, where d1 is larger than zero. In other words, in the top view of FIG. 3B, the TIM films 141 are disposed within, and spaced apart from, the boundaries of the molding material 135. In an example embodiment, all of the TIM films 141 have the same thickness. The shapes and the number of the TIM films 141 illustrated in FIG. 3B are merely non-limiting examples. Other shapes and/or numbers are possible and are fully intended to be included within the scope of the present disclosure. For example, FIGS. 7-10 discussed below illustrate additional embodiments.

Using multiple pre-made sheet-type TIM films on the dies 111 provides advantages over reference methods where a gel-type TIM material is deposited on the dies 111 or where a single pre-formed TIM film is placed on all of the dies 111. Details are discussed below.

Compared with a reference method where a gel-type TIM material is deposited on the upper surfaces of the dies 111, the presently disclosed methods offer multiple advantages. For example, the gel-type TIM material typically has a low thermal conductivity, such as below 3 W/(m·K). In contrast, the TIM film 141 has a much higher thermal conductivity (e.g., larger than 20 W/(m·K)) for improved heat dissipation. The gel-type TIM material typically needs to be stored at a lower temperature (e.g., −40° C.), whereas the sheet-type TIM film 141 may be stored at room temperature. To reduce voids (e.g., air bubbles) between the cured gel-type TIM material and the dies 111, the gel-type TIM material may have to be deposited in special patterns. Even with special patterns, voids may still be formed in the cured gel-type TIM material. In contrast, no special pattern needs to be designed for the sheet-type TIM film 141, and no void (e.g., air bubble) is formed using the disclosed embodiments herein.

Furthermore, the shape and the dimension of the deposited gel-type TIM material is difficult to control, which often leads to low coverage ratio (e.g., a ratio between upper surface areas of the dies 111 covered by the TIM material and upper surface areas of the dies 111 without the TIM material) of the dies 111, because certain regions of the upper surfaces of the dies 111 may not have the gel-type TIM material deposited. As a result, after being cured, the coverage ratio using the gel-type TIM material is relatively low, such as around 83%. In contrast, the TIM film 141 is pre-formed (e.g., in a sheet format), and may be cut into any suitable shape and/or dimension and is easily laminated on the upper surface of the die 111. As a result, after being cured, the TIM films 141 achieve a high coverage ratio larger than 90% for all the dies 111, which in turn results in improved heat dissipation for the dies 111. Since the sheet-type TIM film is easily laminated on the dies 111, the throughput of the manufacturing process is much higher than that of a process where a gel-type TIM material is deposited on the dies 111.

Compared with a reference method where a single sheet-type TIM film is laminated on top of all of the dies 111, the currently disclosed methods offer additional advantages. The semiconductor device 100 (e.g., a CoW structure) may have warpage during thermal cycles, due to the different materials of the CoW structure having different coefficients of thermal expansion (CTEs). The warpage is typically worse for larger sized semiconductor packages and is worse near the perimeters (e.g., near sidewalls) of the semiconductor packages. It has been observed that when a single, large, sheet-type TIM film 141 is laminated on all of the dies 111, the perimeter portions of the single TIM film 141 experience large stress and may delaminate (e.g., separate from the upper surfaces of the dies 111 located under the perimeter portions), which reduces the coverage ratio of the dies 111 and results in reduced heat dissipation efficiency. In contrast, the currently disclosed methods uses multiple, smaller, sheet-type TIM films 141 to laminate on the dies 111. Due to the smaller size of each of the TIM films 141, the variation in the amount of warpage experienced across each of the TIM films 141 is smaller, and therefore, the smaller TIM film 141 is less likely to delaminate from the underling die 111, thereby improving the coverage ratio of the dies 111 and the heat dissipation efficiency. Tests have shown that with multiple, smaller TIM films 141 used, a coverage ratio of 93% or better for all the dies 111 can be achieved after the TIM films 141 are cured. Additionally, the smaller TIM films 141 do not increase the stress level in the semiconductor device 100, and do not increase the warpage of the semiconductor device 100.

Figure 4:
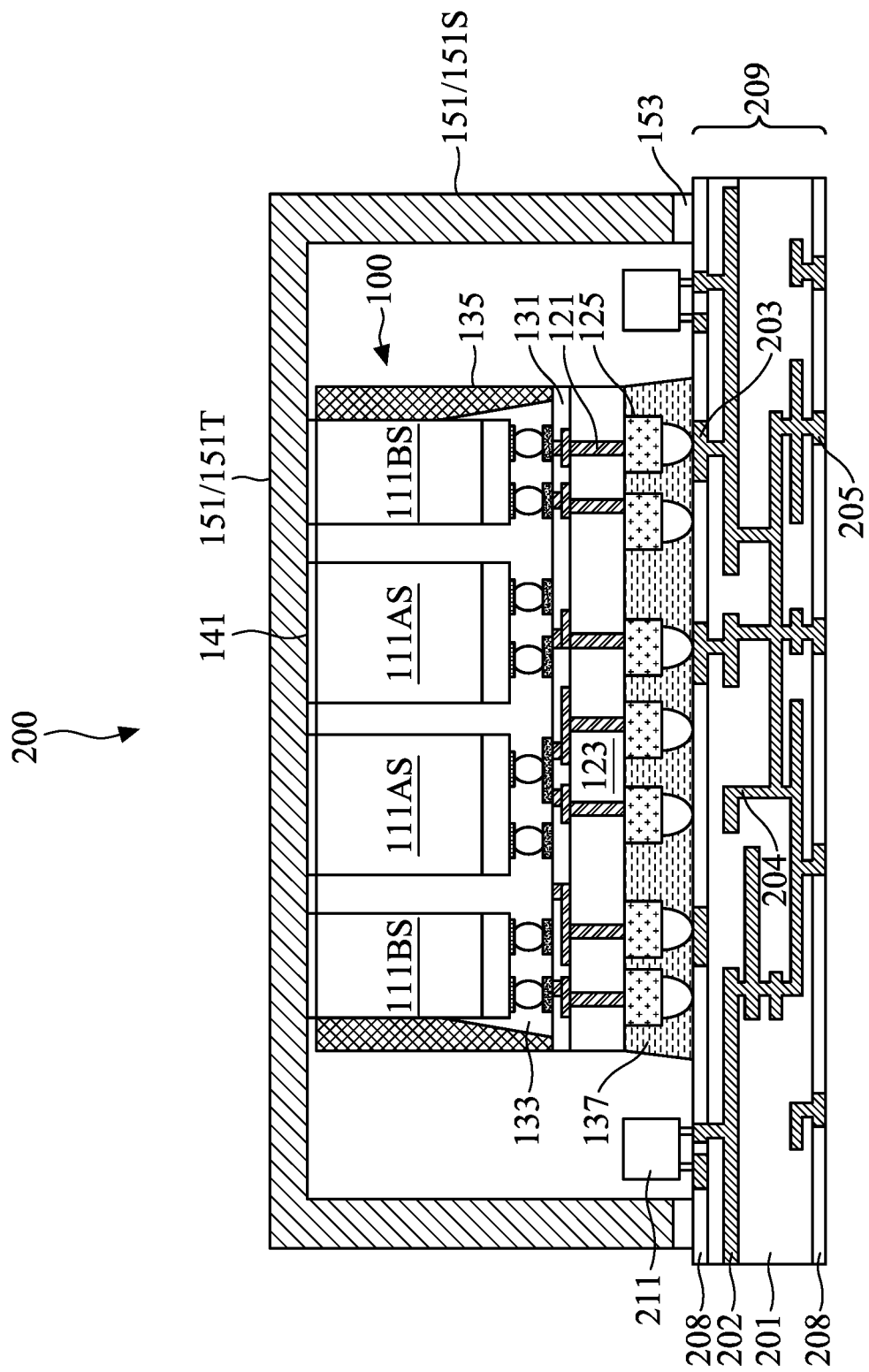

Next, in FIG. 4, a heat-dissipation lid 151 (also referred to as a lid) is attached to the upper surface of the substrate 209 to form an enclosed space between the heat-dissipation lid 151 and the substrate 209. The lid 151 may be formed of a material suitable for heat dissipation, such as copper, aluminum, steel, or the like. In FIG. 4, the lid 151 has a top portion 151T and sidewall portions 151S. The sidewall portions 151S are attached by, e.g., a glue 153, to the upper surface of the substrate 209. In an embodiment, the lid 151 is formed of a metal material and is electrically isolated. In another embodiment, the lid 151 is formed of a metal material and is electrically coupled to a conductive pad 203 (e.g., by a solder region) configured to be connected to electrical ground, in which case the lid 151 also serves as an electro-magnetic interference (EMI) shield for the semiconductor device 100.

As illustrated in FIG. 4, the semiconductor device 100, the TIM films 141, and the passive components 211 are disposed in the enclosed space between the lid 151 and the substrate 209. The TIM films 141 are disposed between the top portion 151T of the lid 151 and the upper surfaces of the dies 111. In particular, an upper surface of each TIM film 141 contacts (e.g., physically contacts) the top portion 151T, and a lower surface of each TIM film 141 contacts (e.g., physically contacts) the upper surface of the semiconductor device 100 (e.g., the upper surface of the die 111, the upper surface of the molding material 135, and/or the upper surface of the underfill material 133).

Figure 5:
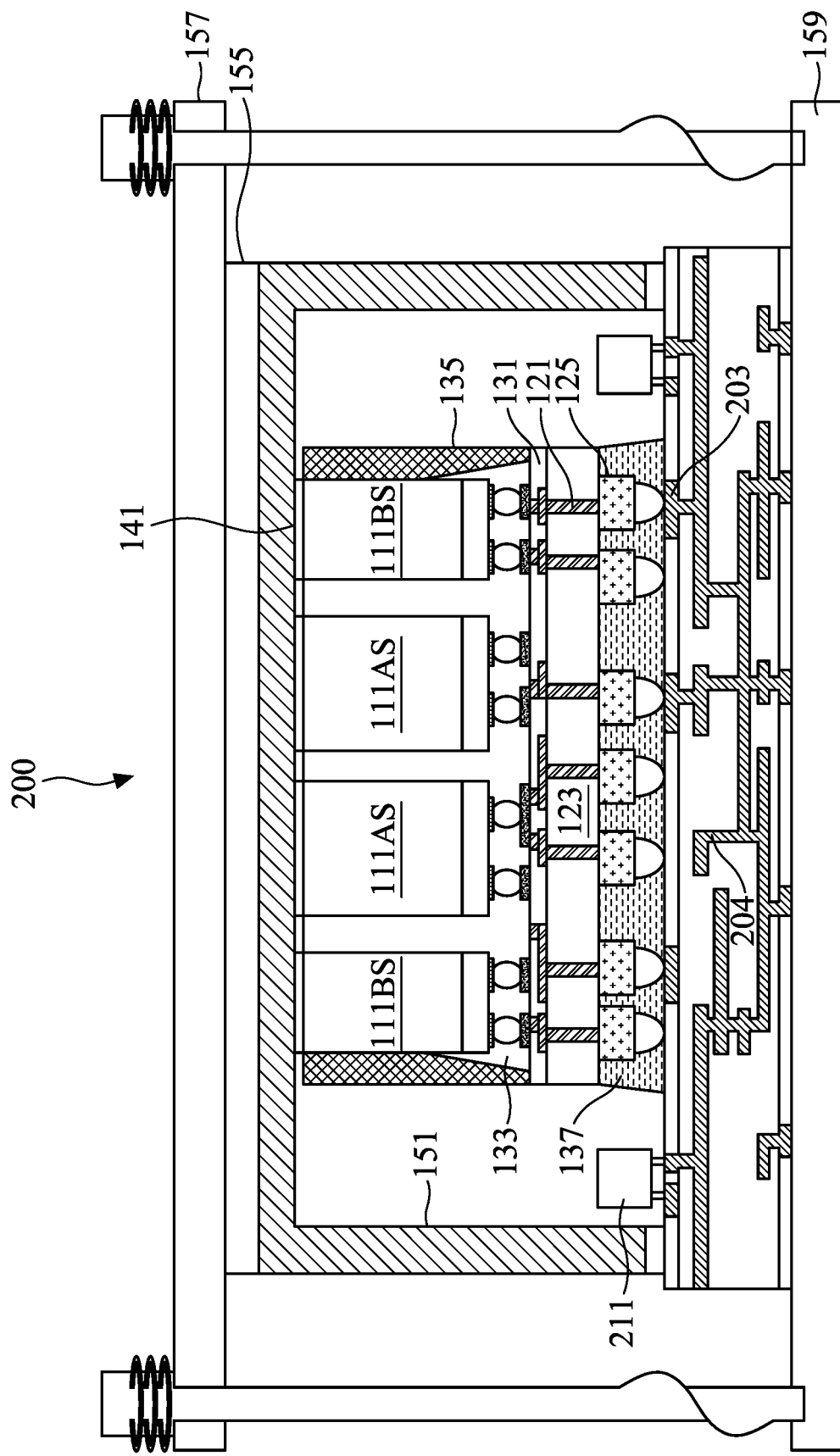

Next, in FIG. 5, the semiconductor device 200 is clamped between a top jig 157 and a bottom jig 159 of a clamp. A rubber pad 155 may be placed between the top jig 157 and the lid 151 to prevent damage to the semiconductor device 200. Next, while being clamped between the top jig 157 and the bottom jig 159, the semiconductor device 200 is heated to a pre-determined temperature (e.g., between 25° C. and 150° C.) for a pre-determined period of time (e.g., less than 1000 hours). The heating process cures the TIM films 141.

Figure 6:
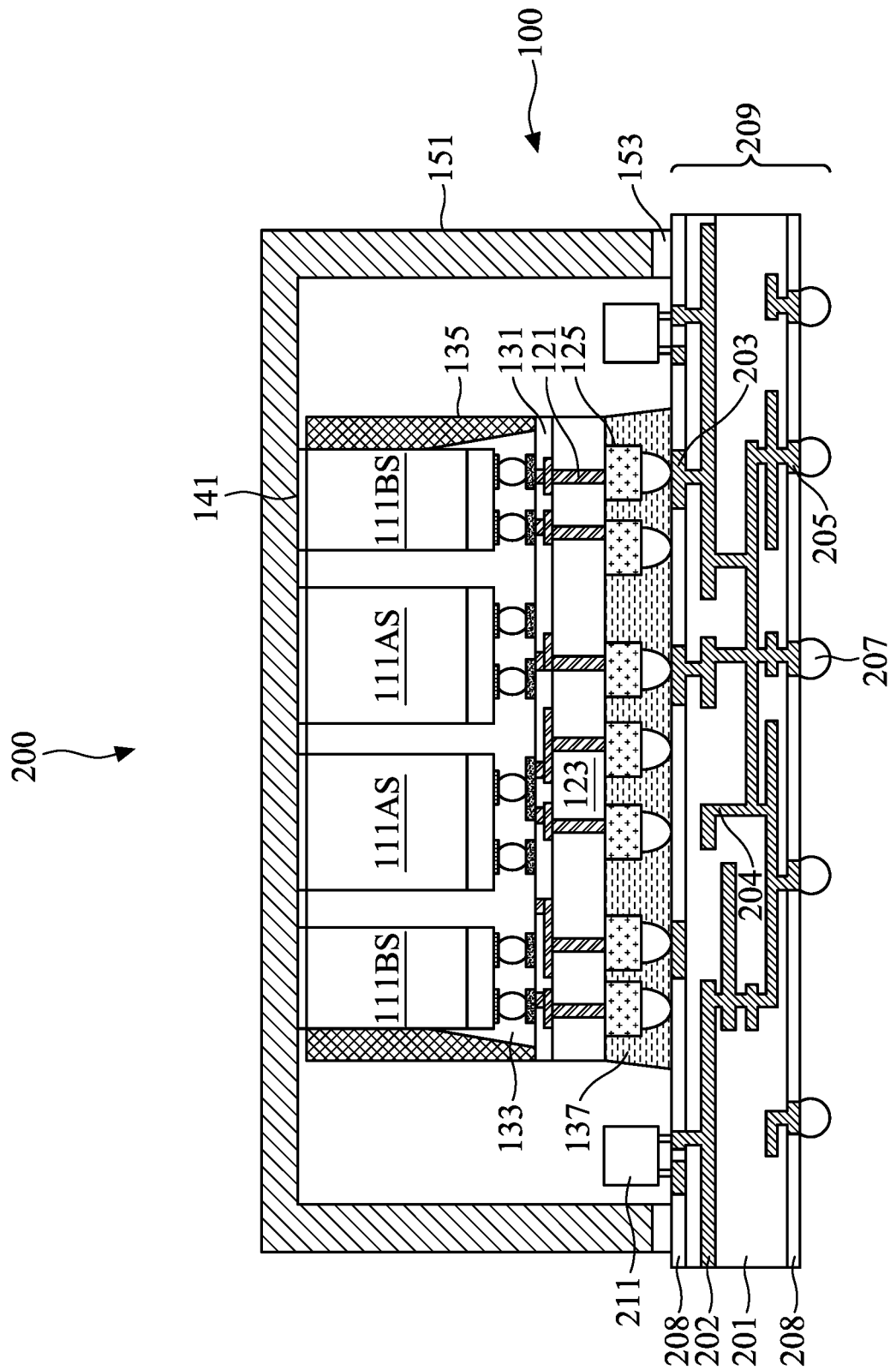

Next, in FIG. 6, the semiconductor device 200 is removed from the clamp, and conductive bumps 207 are formed on the conductive pads 205 at the lower surface of the substrate 209. The conductive bumps 207 may be solder balls, copper pillars, combinations thereof, or the like. Therefore, the semiconductor device 100, the passive components 211, and the conductive bumps 207 are electrically interconnected through the conductive features (e.g., conductive lines or vias) of the substrate 209.

Figure 7:
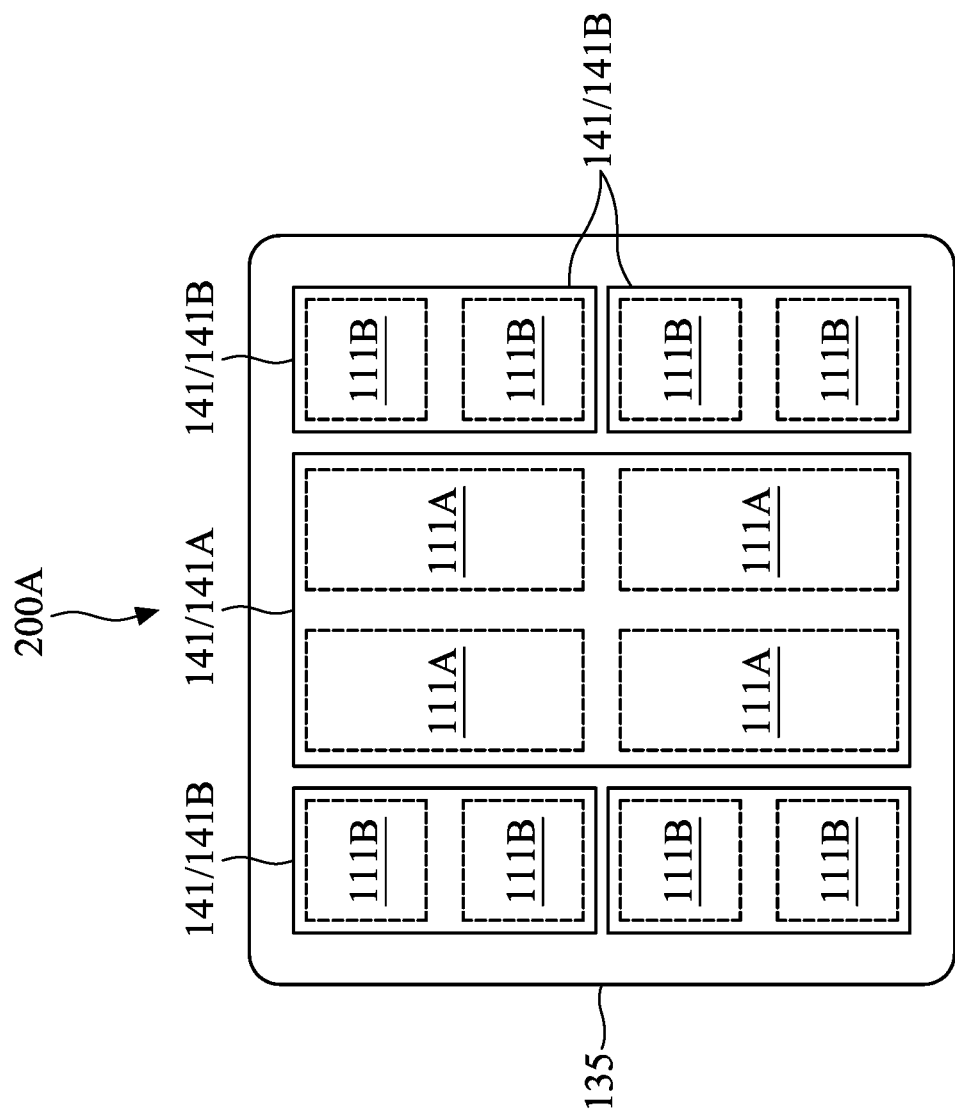
FIGS. 7-10 illustrate various example top views of a semiconductor device, in accordance with some embodiments.

FIG. 7 illustrates the top view of a semiconductor device 200A, in accordance with an embodiment. The semiconductor device 200A is similar to the semiconductor device 200, but the number and the shapes of the TIM films 141 are different. For example, compared with the top view of FIG. 3B, a subset of the dies 111 (e.g., the dies 111A in the center region) of the semiconductor device 200A in FIG. 7 are covered by a larger TIM film 141 (labeled as 141A), and other subsets of the dies 111 (e.g., every two adjacent dies 111B in the peripheral regions) of the semiconductor device 200 are covered by smaller TIM films 141 (labeled as 141B).

Note that in FIG. 7, the dies 111 (e.g., 111A and 111B) are grouped into different subsets of dies, and each subset of dies 111 are covered by a respective TIM film 141 (e.g., 141A or 141B). The shape of each TIM film 141 (e.g., 141A or 141B) follows the contour of the respective subset of dies 111. Here the term "contour" is used to describe the shape defined by the exterior boundaries of the subset of dies 111. For example, the contour of the subset of dies 111A is a rectangle shape, where the four sides of the rectangle shape are defined by the exterior sidewalls of the dies 111A distal from a center of the subset of dies 111A. In the example of FIG. 7, the dimension of each TIM film 141 is larger than the contour of the underlying subset of dies 111, and therefore, the shape of each TIM film 141 is a scaled (e.g., enlarged) version of the contour of the underlying subset of dies 111. In other embodiments, the dimension of each TIM film 141 is the same as the contour of the underlying subset of dies 111, such that in the top view, the TIM film 141 completely overlaps with the contour of the underlying subset of dies 111. Therefore, the shape of each TIM film 141 is a geometric similar shape of the contour of the underlying subset of dies 111.

The TIM films 141A and 141B in FIG. 7 are sheet-type TIM films and are formed of the same material as the TIM film 141 of the semiconductor device 200. The sizes of the TIM films 141A and 141B in FIG. 7 are larger than the sizes of the TIM films 141 in FIG. 3B, but still smaller than the size of a single, large TIM film that covers all of the dies 111. Therefore, the advantages of less stress, less delamination, and improved coverage ratio of the dies 111 still remain. In addition, due to the reduced number of TIM films 141 used in FIG. 7, the manufacturing time for laminating the TIM films 141 on the dies 111 may be reduced.

In FIG. 7, the TIM films 141A and 141B have different shapes, but are formed of a same material. In some embodiments, the TIM films 141A and 141B have a same thickness, e.g., because the TIM films 141A and 141B are formed by cutting a same large, sheet-type TIM film into pieces having the shapes/dimensions of the TIM films 141A and 141B. In other embodiments, the TIM films 141A and 141B have different thicknesses. In particular, the TIM films 141B, which are located along peripheral regions of the semiconductor device 200A, have a thickness larger than a thickness of the TIM film 141A, which is located in the center region of the semiconductor device 200A. For example, the TIM film 141B may be 10% to 20% thicker than the TIM film 141A. Since the amount of warpage in the peripheral regions of the semiconductor device 200A is typically larger, and since the TIM films 141B are located at the peripheral regions, the thickness of the TIM films 141B are increased compared with the TIM film 141A, in order to compensate for the increased amount of warpage at the peripheral regions of the device. The thicker TIM film 141B may advantageously reduce delamination of the TIM films at the peripheral regions and reduce the stress of the package, thereby improving the heat dissipation efficiency and the structural integrity of the device formed.

Figure 8:
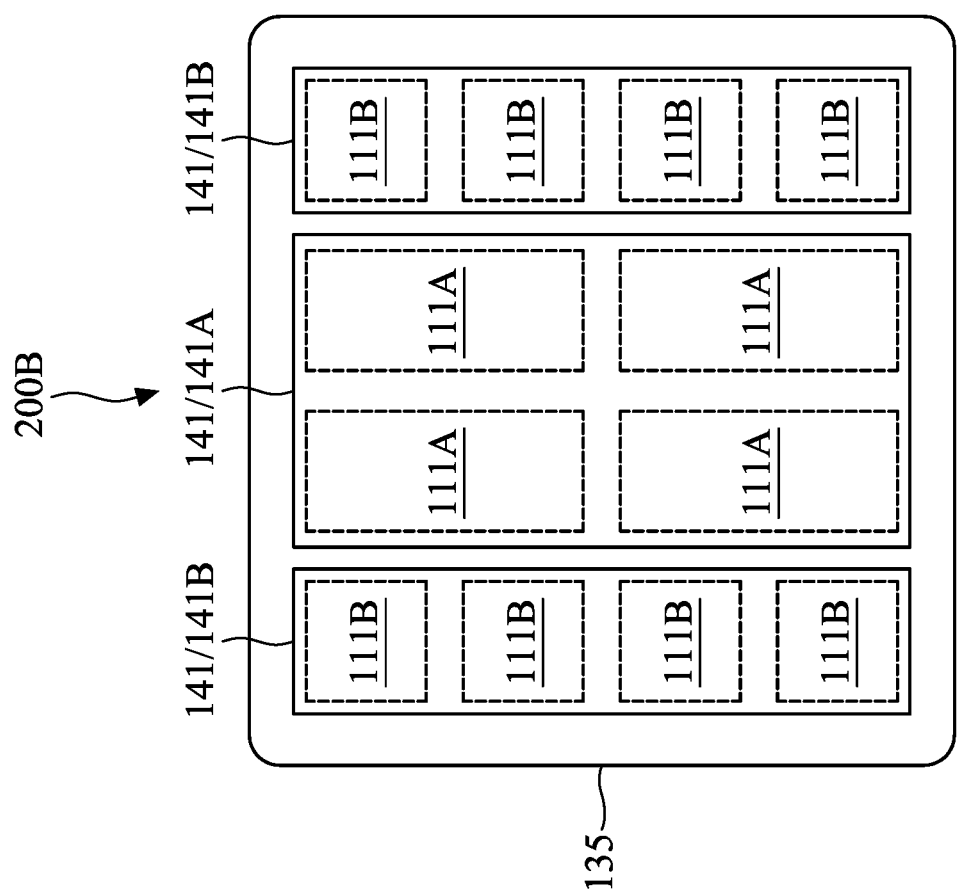

FIG. 8 illustrates the top view of a semiconductor device 200B, in accordance with an embodiment. The semiconductor device 200B is similar to the semiconductor device 200A, but each subset of dies 111B includes four dies instead of two dies as in FIG. 7. Note that similar to FIG. 7, the TIM film 141A over the center region of the semiconductor device 200B may be thinner than the TIM films 141B over the peripheral regions of the semiconductor device 200B. In some embodiments, the TIM films 141A and 141B have a same thickness.

Figure 9:
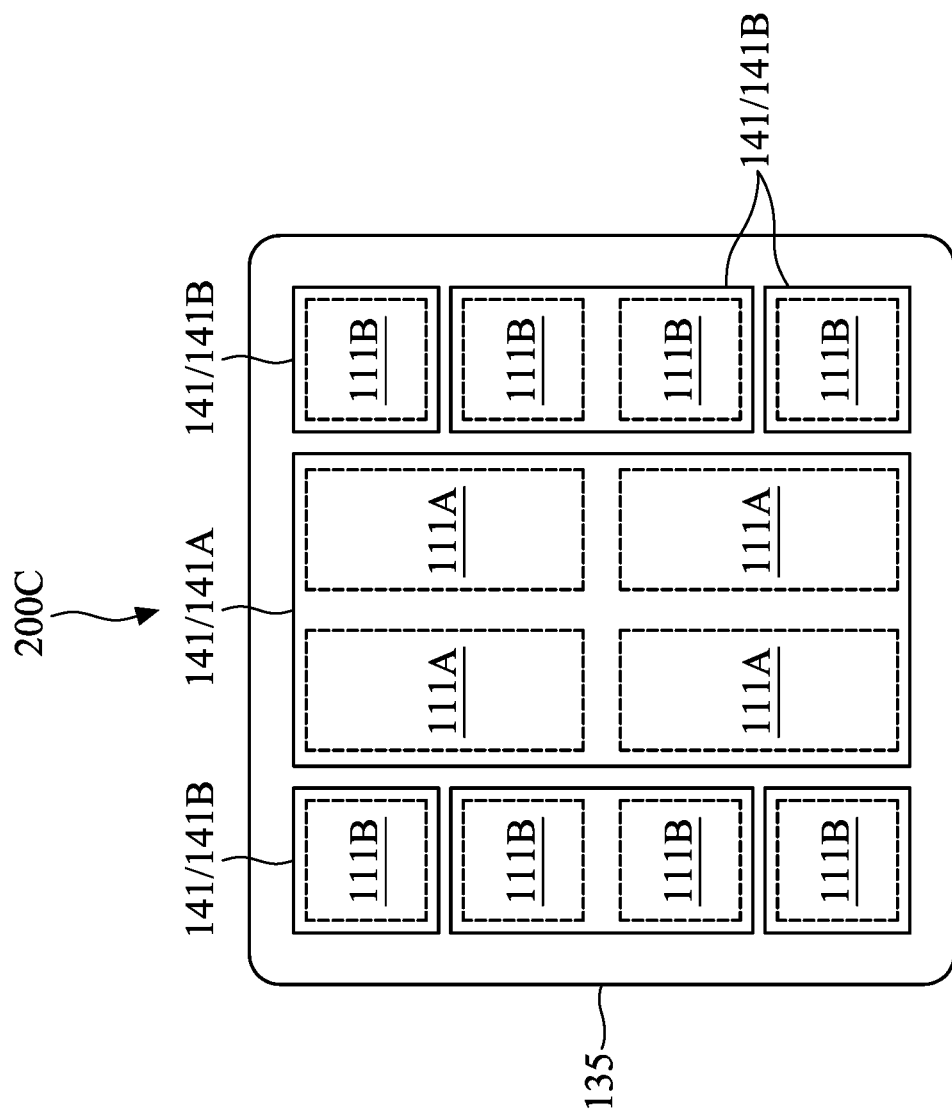

FIG. 9 illustrates the top view of a semiconductor device 200C, in accordance with an embodiment. The semiconductor device 200C is similar to the semiconductor device 200A, but some subsets of dies 111B include two dies, while other subsets of dies 111B may include only one die. Note that similar to FIG. 7, the TIM film 141A over the center region of the semiconductor device 200C may be thinner than the TIM films 141B over the peripheral regions of the semiconductor device 200C. In some embodiments, the TIM films 141A and 141B have a same thickness.

Figure 10:
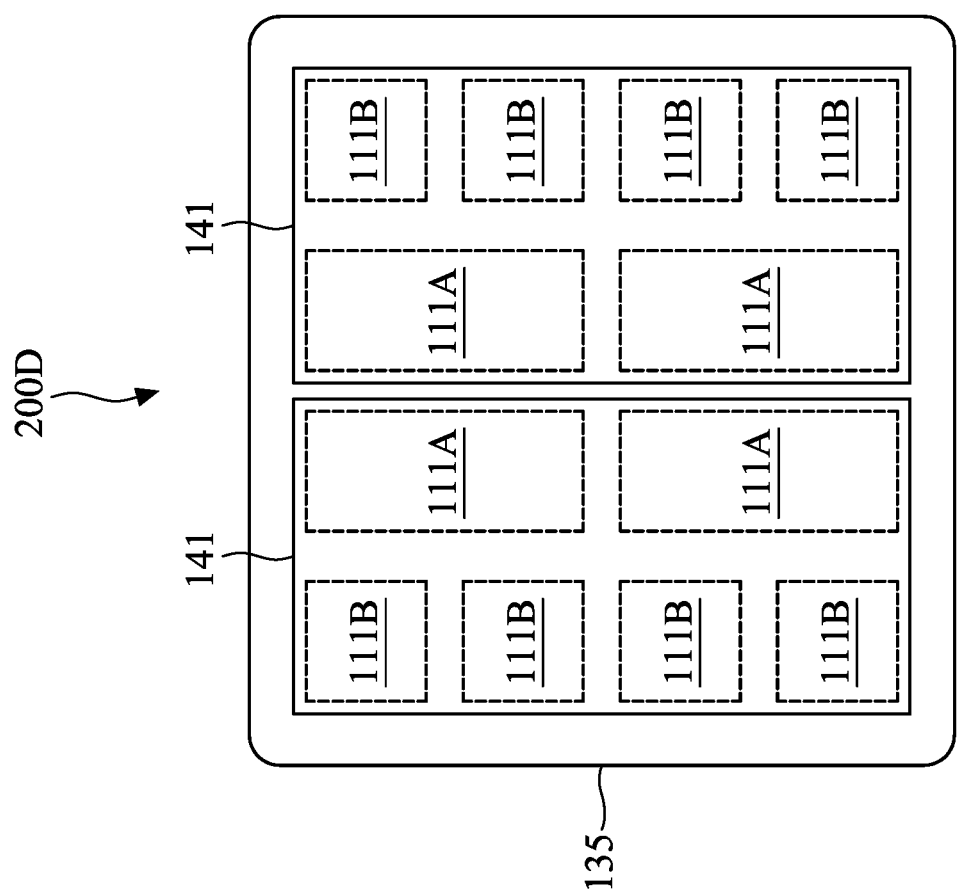

FIG. 10 illustrates the top view of a semiconductor device 200D, in accordance with an embodiment. The semiconductor device 200D is similar to the semiconductor device 200, but may only have two subsets of dies, where each subset of dies includes the dies 111 (e.g., 111A and 111B) located in half of the upper surface area of the semiconductor device 200D. The TIM films 141 of FIG. 10 have a same thickness, in some embodiments.

Figure 11:
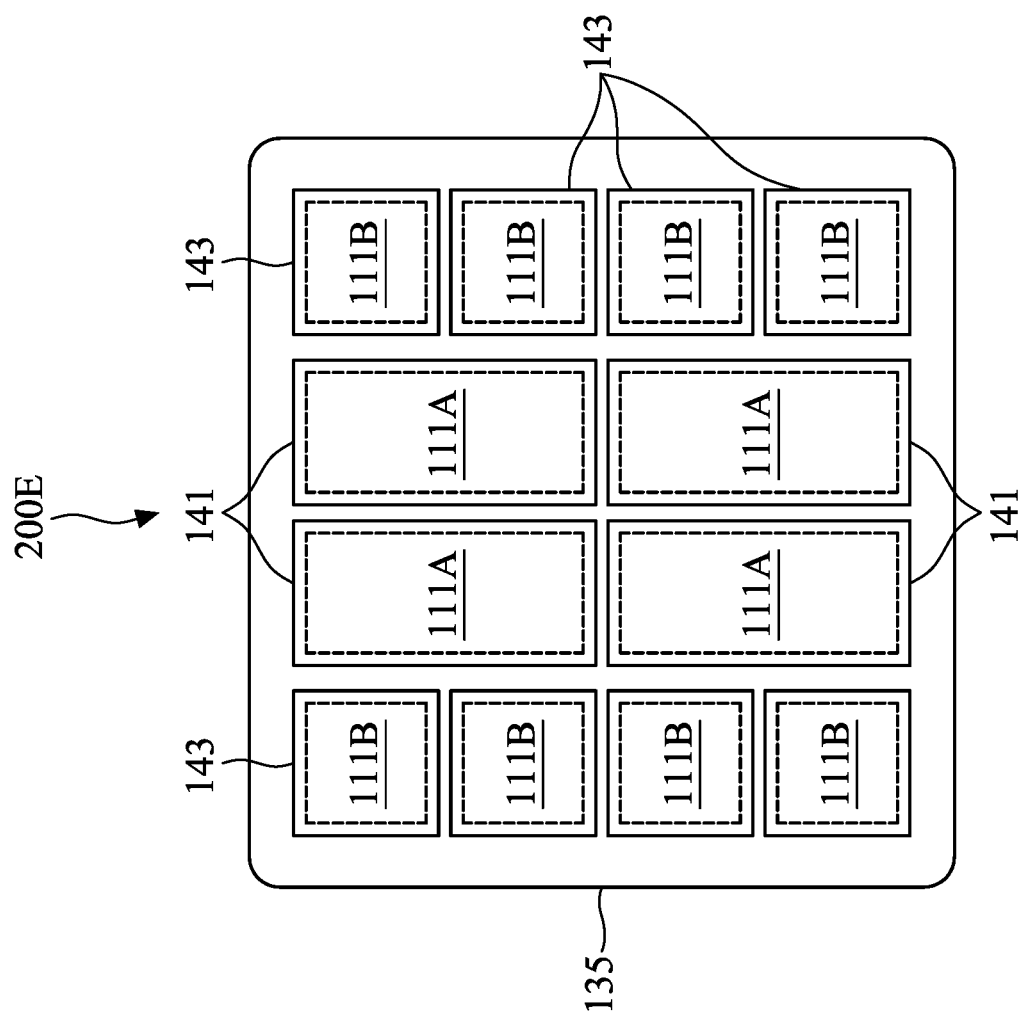
FIGS. 11-14 illustrate various example top views of a semiconductor device, in accordance with some embodiments.

FIG. 11 illustrates the top view of a semiconductor device 200E, in accordance with an embodiment. The semiconductor device 200E is similar to the semiconductor device 200 (see FIG. 3B), but each die 111B is covered by a TIM film 143, where the TIM film 143 is formed of a different material from the TIM films 141 disposed over the dies 111A. In other words, the dies 111A, which are located in the center regions of the semiconductor device 200E, are covered by the TIM film 141, and the dies 111B, which are located in peripheral regions of the semiconductor device 200E, are covered by TIM film 143.

In an example embodiment, the TIM film 141 is the same as the TIM film 141 in FIG. 3B, such as a pre-formed sheet-type TIM film which is then laminated on the dies 111A. The TIM film 143, however, is formed by applying a gel-type TIM material on the dies 111B then curing the gel-type TIM material. The gel-type TIM material may be, e.g., an adhesive with metal filler, such as a silicone gel with aluminum or zinc as filler. In some embodiments, the TIM film 143 is thicker than the TIM film 141 to compensate for the increased warpage at the peripheral regions of the semiconductor package. The semiconductor device 200E may be referred to as a semiconductor package with a hybrid TIM film. The use of gel-type TIM material in the peripheral regions of the semiconductor package may be suitable for packages with large warpage that could not be compensated well by using a thick sheet-type TIM film.

Figure 12:
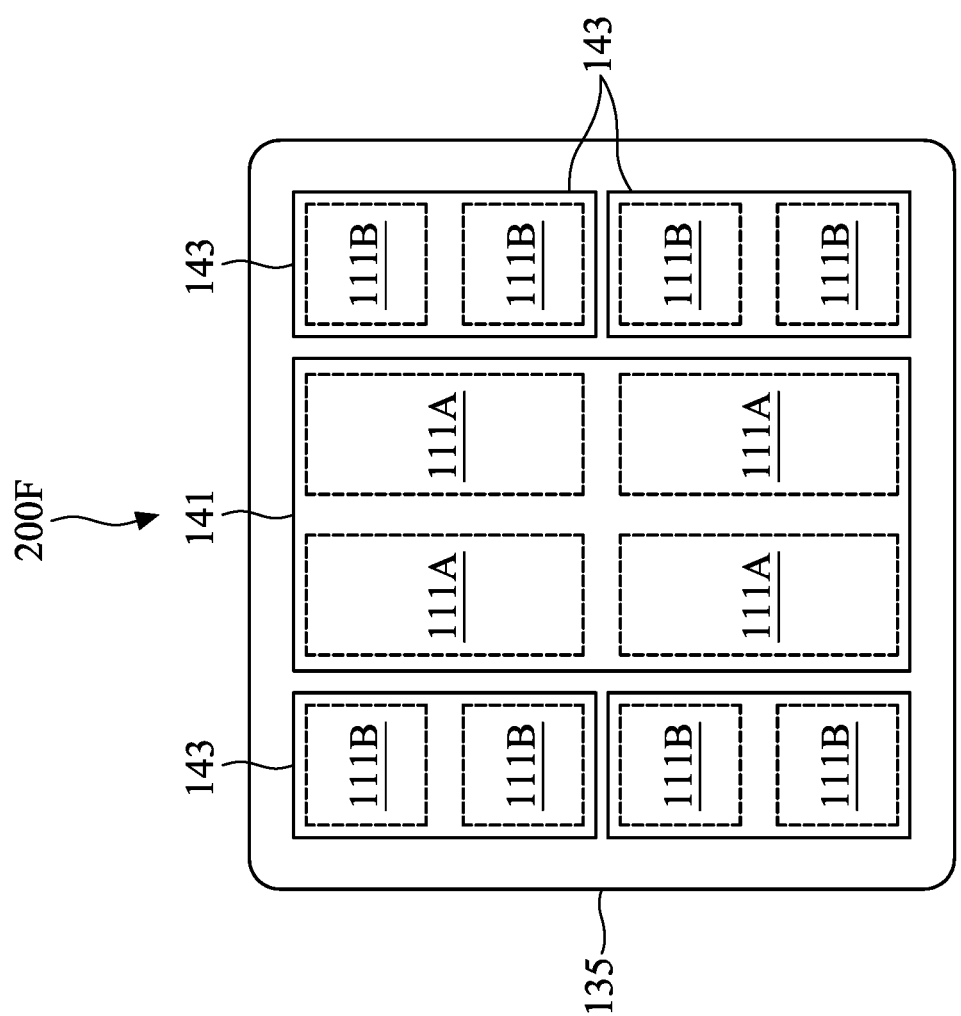

FIG. 12 illustrates the top view of a semiconductor device 200F, in accordance with an embodiment. The semiconductor device 200F is similar to the semiconductor device 200E of FIG. 11, but with different subsets of dies 111. In particular, the four dies 111A in the center region of the semiconductor device 200F are covered by a sheet-type TIM film 141. Each subset of dies 111B includes two dies 111B in the peripheral regions, and the dies 111B in each subset are covered by a respective TIM film 143.

Figure 13:
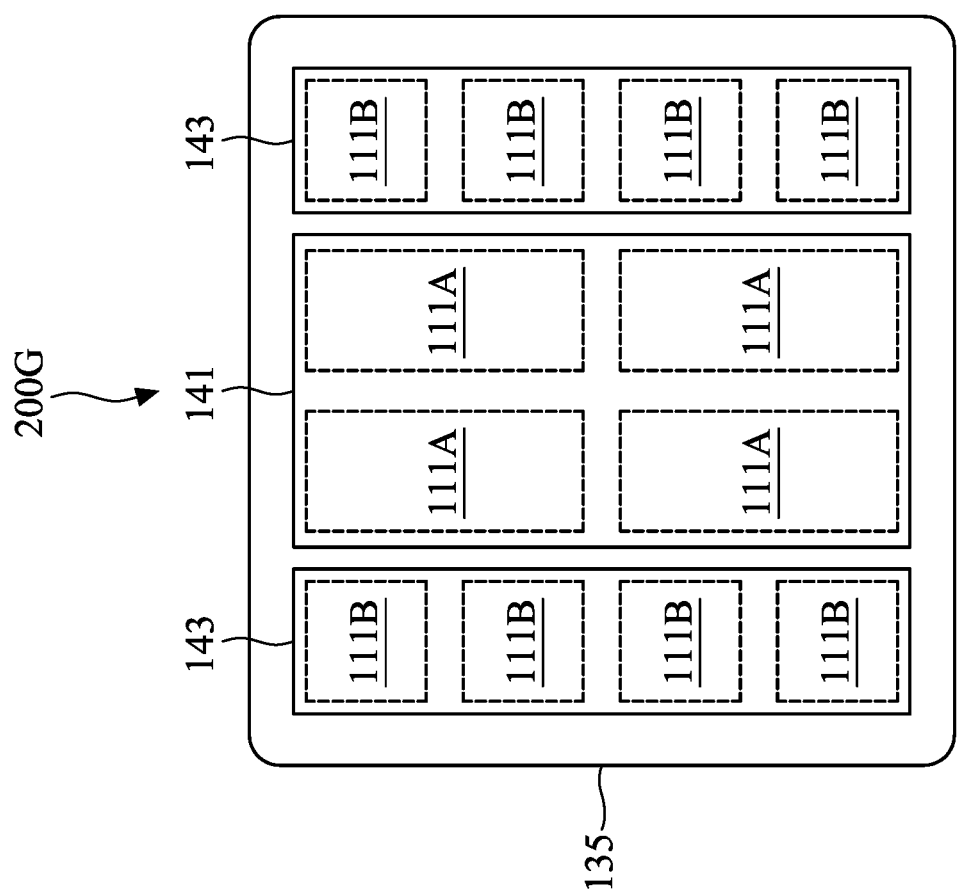

FIG. 13 illustrates the top view of a semiconductor device 200G, in accordance with an embodiment. The semiconductor device 200G is similar to the semiconductor device 200F of FIG. 12, but with different number of subsets of dies 111. In particular, the four dies 111A in the center region of the semiconductor device 200G are covered by a sheet-type TIM film 141. Each subset of dies 111B includes four dies 111B in the peripheral regions, and the dies 111B in each subset are covered by a respective TIM film 143.

Figure 14:
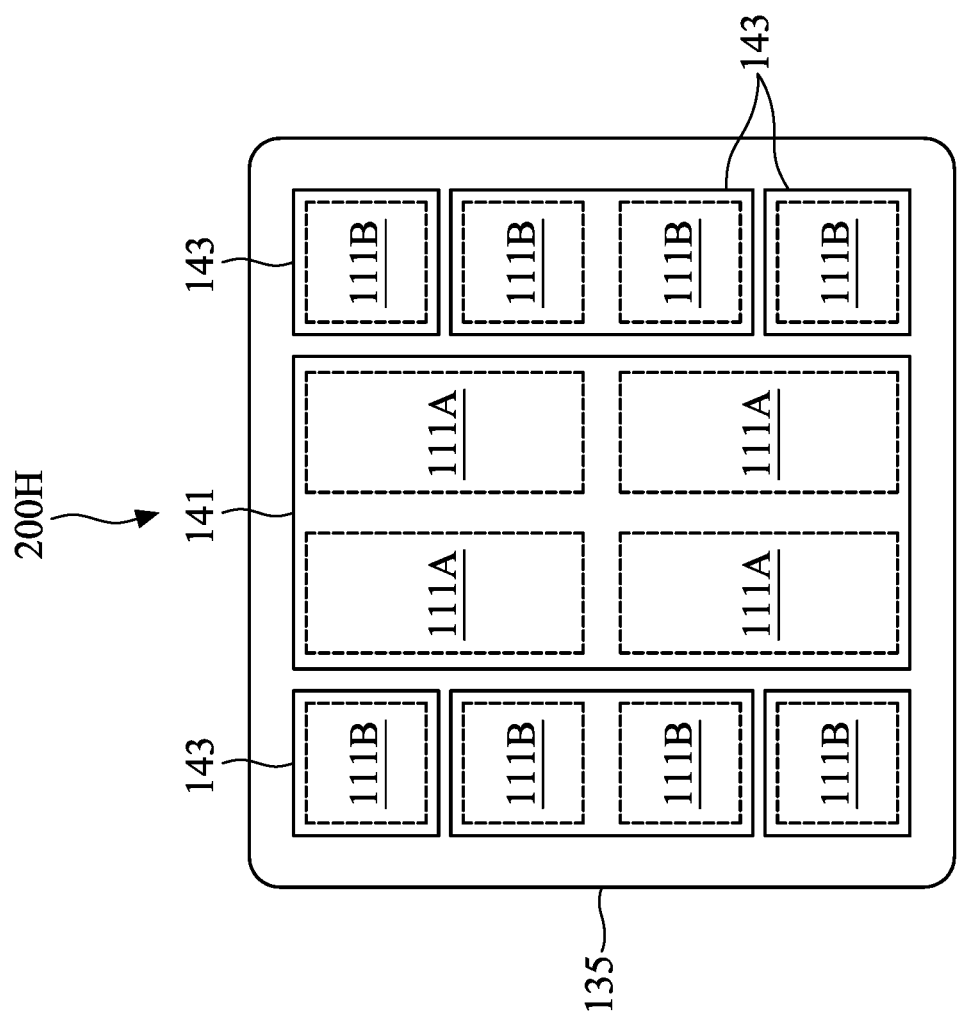

FIG. 14 illustrates the top view of a semiconductor device 200H, in accordance with an embodiment. The semiconductor device 200H is similar to the semiconductor device 200F of FIG. 12, but with different number of subsets of dies 111. In particular, the four dies 111A in the center region of the semiconductor device 200H are covered by a sheet-type TIM film 141. The dies 111B in the peripheral regions are grouped into different subsets, where some subsets include two dies 111B, while other subsets may only include one die 111B. The dies 111B in each subset are covered by a respective TIM film 143.

Embodiments may achieve advantages. Compared with a gel-type TIM material, higher thermal conductivity is achieved for more efficient heat dissipation using the sheet-type TIM film 141. The shape and the thickness of the TIM films 141 can be easily controlled to achieve an excellent coverage ratio of more than 93% for the dies 111 after the TIM films 141 are cured. Since the TIM film 141 is pre-made, it is easily used in the manufacturing process to achieve higher throughput than gel-type TIM materials. Compared with a single TIM film that covers all of the dies 111, the disclosed method uses multiple TIM films that each covers a subset of the dies, which allows for reduced stress in the package. Little or no TIM film delamination is observed, thereby increasing the coverage ratio of the dies and improving heat dissipation efficiency. In addition, by using thicker TIM films and/or a different material for the TIM films over dies located in the peripheral regions of the semiconductor package, delamination of the TIM film is further reduced and the device integrity is improved.

Figure 15:
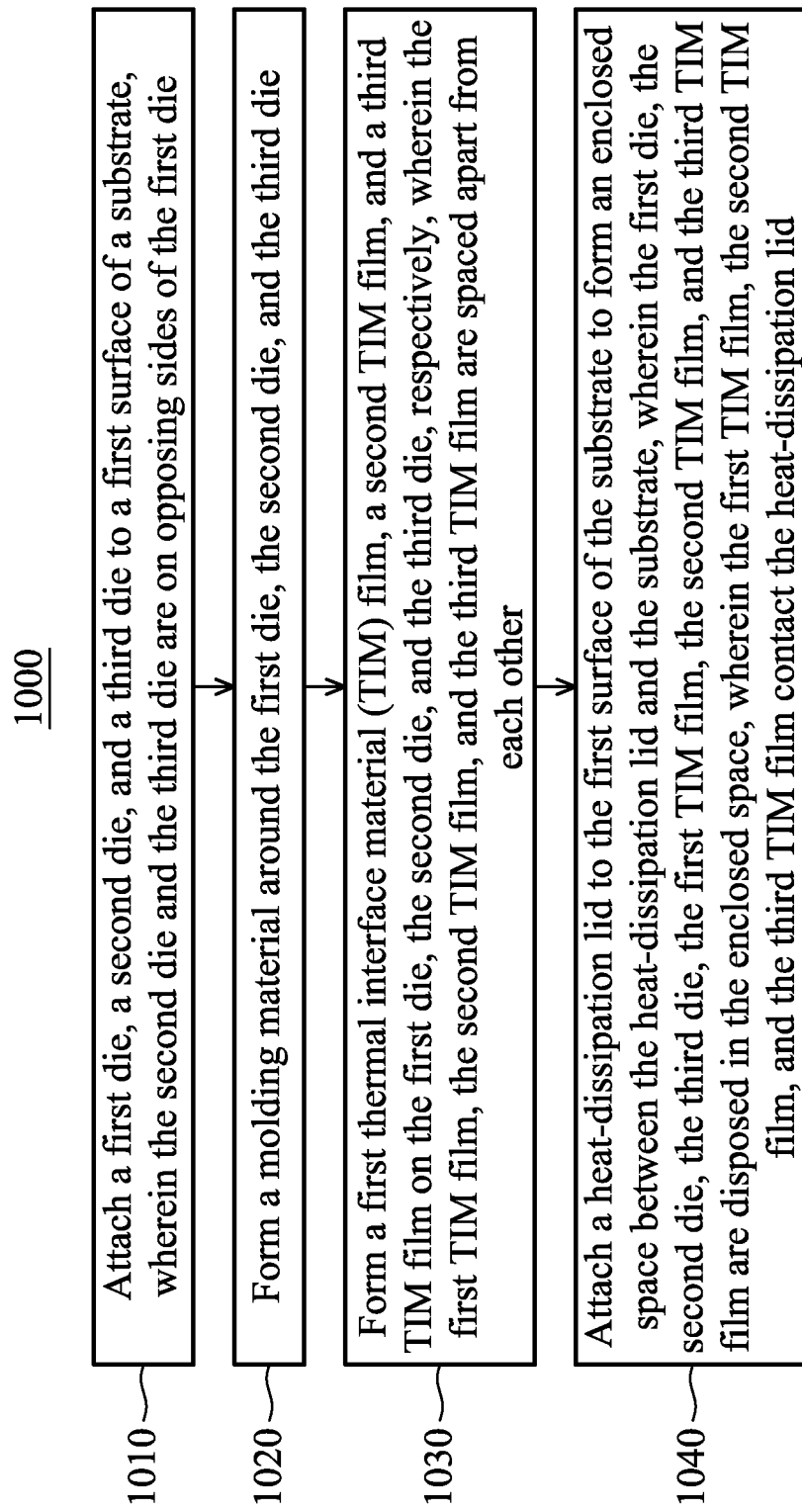
FIG. 15 illustrates a flow chart of a method of forming a semiconductor structure, in some embodiments.

FIG. 15 illustrates a flow chart of a method 1000 of forming a semiconductor structure, in some embodiments. It should be understood that the embodiment method shown in FIG. 15 is merely an example of many possible embodiment methods. One of ordinary skill in the art would recognize many variations, alternatives, and modifications. For example, various steps as illustrated in FIG. 15 may be added, removed, replaced, rearranged and repeated.

Referring to FIG. 15, at block 1010, a first die, a second die, and a third die are attached to a first surface of a substrate, wherein the second die and the third die are on opposing sides of the first die. At block 1020, a molding material is formed around the first die, the second die, and the third die. At block 1030, a first thermal interface material (TIM) film, a second TIM film, and a third TIM film are formed on the first die, the second die, and the third die, respectively, wherein the first TIM film, the second TIM film, and the third TIM film are spaced apart from each other. At block 1040, a heat-dissipation lid is attached to the first surface of the substrate to form an enclosed space between the heat-dissipation lid and the substrate, wherein the first die, the second die, the third die, the first TIM film, the second TIM film, and the third TIM film are disposed in the enclosed space, wherein the first TIM film, the second TIM film, and the third TIM film contact the heat-dissipation lid.

In accordance with an embodiment, a semiconductor structure includes: a substrate; a package attached to a first surface of the substrate, wherein the package comprises: an interposer, wherein a first side of the interposer is bonded to the first surface of the substrate through first conductive bumps; a plurality of dies attached to a second side of the interposer opposing the first side; and a molding material on the second side of the interposer around the plurality of dies; a plurality of thermal interface material (TIM) films on a first surface of the package distal from the substrate, wherein each of the TIM films is disposed directly over at least one respective die of the plurality of dies; and a heat-dissipation lid attached to the first surface of the substrate, wherein the package and the plurality of TIM films are disposed in an enclosed space between the heat-dissipation lid and the substrate, wherein the heat-dissipation lid contacts the plurality of TIM films. In an embodiment, the plurality of TIM films are laterally spaced apart from each other. In an embodiment, in a plan view, the molding material surrounds the plurality of dies, and the plurality of the TIM films are disposed within, and spaced apart from, boundaries of the molding material. In an embodiment, the plurality of TIM films are graphene films. In an embodiment, each of the plurality of TIM films is disposed over a respective die of the plurality of dies and has a geometric similar shape as the respective die. In an embodiment, the plurality of dies include a first subset of dies and a second subset of dies, wherein the plurality of TIM films comprises: a first TIM film disposed directly over the first subset of dies, wherein the first TIM film has a geometric similar shape as a contour of the first subset of dies; and a second TIM film disposed directly over the second subset of dies, wherein the second TIM film has a geometric similar shape as a contour of the second subset of dies. In an embodiment, in a top view, the plurality of dies comprises: a first die in a center region of the first surface of the package; and a second die in a first peripheral region of the first surface of the package, wherein the plurality of TIM films comprise a first TIM film directly over the first die and comprise a second TIM film directly over the second die, wherein a first thickness of the first TIM film is smaller than a second thickness of the second TIM film. In an embodiment, the first TIM film and the second TIM film comprise different materials. In an embodiment, the first TIM film is a graphene film, and the second TIM film is an adhesive with metal filler. In an embodiment, the plurality of dies further comprises a third die in a second peripheral region of the first surface of the package, the second die and the third die being disposed laterally on opposing sides of the first die, wherein the TIM film further comprises a third TIM film directly over the third die, wherein a third thickness of the third TIM film is larger than the first thickness of the first TIM film. In an embodiment, the first TIM film and the second TIM film are different materials, wherein the second TIM film and the third TIM film are a same material.

In accordance with an embodiment, a semiconductor structure includes: a substrate; a first die, a second die, and a third die attached to a first side of the substrate, wherein the second die and the third die are disposed laterally on opposing sides of the first die; a molding material over the first side of the substrate, wherein the first die, the second die, and the third die are embedded in the molding material; a heat-dissipation lid attached to the first side of the substrate, wherein the first die, the second die, and the third die are in an enclosed space between the heat-dissipation lid and the substrate; and thermal interface material (TIM) films between the heat-dissipation lid and the first die, the second die, and the third die, wherein the TIM films comprise a first TIM film, a second TIM film, and a third TIM film disposed over the first die, the second die, and the third die, respectively, wherein the TIM films are laterally spaced apart from each other. In an embodiment, each of the TIM films has a geometric similar shape as an underlying die. In an embodiment, the semiconductor structure further includes a fourth die attached to the first side of the substrate, wherein the second die and the fourth die are on a same side of the first die, wherein the first TIM film covers the first die and has a first geometric similar shape as the first die, wherein the second TIM film covers the second die and the fourth die, and has a second geometric similar shape as a contour of the second die and the fourth die. In an embodiment, a first thickness of the first TIM film is smaller than a second thickness of the second TIM film and smaller than a third thickness of the third TIM film. In an embodiment, the second thickness is a same as the third thickness. In an embodiment, the first TIM film is formed of a first material, wherein the second TIM film and the third TIM film are formed of a second material different from the first material.

In accordance with an embodiment, a method of forming a semiconductor structure includes: attaching a first die, a second die, and a third die to a first surface of a substrate, wherein the second die and the third die are on opposing sides of the first die; forming a molding material around the first die, the second die, and the third die; forming a first thermal interface material (TIM) film, a second TIM film, and a third TIM film on the first die, the second die, and the third die, respectively, wherein the first TIM film, the second TIM film, and the third TIM film are spaced apart from each other; and attaching a heat-dissipation lid to the first surface of the substrate to form an enclosed space between the heat-dissipation lid and the substrate, wherein the first die, the second die, the third die, the first TIM film, the second TIM film, and the third TIM film are disposed in the enclosed space, wherein the first TIM film, the second TIM film, and the third TIM film contact the heat-dissipation lid. In an embodiment, forming the first TIM film, the second TIM film, and the third TIM film comprises placing a first pre-formed TIM sheet, a second pre-formed TIM sheet, and a third pre-formed TIM sheet on the first die, the second die, and the third die, respectively, wherein the second pre-formed TIM sheet and the third pre-formed TIM sheet are thicker than the first pre-formed TIM sheet. In an embodiment, forming the first TIM film, the second TIM film, and the third TIM film comprises: placing a pre-formed sheet-type TIM on the first die; and dispensing a gel-type TIM on the second die and the third die, wherein the pre-formed sheet-type TIM and the gel-type TIM comprise different materials.

What is claimed is:

1. A method of forming a semiconductor structure, the method comprising:
    attaching a first die, a second die, and a third die to a first side of an interposer, wherein the second die and the third die are on opposing sides of the first die;
    forming a molding material on the interposer, wherein the molding material surrounds the first die, the second die, and the third die;
    forming a first thermal interface material (TIM) film, a second TIM film, and a third TIM film on the first die, the second die, and the third die, respectively, wherein the first TIM film, the second TIM film, and the third TIM film are spaced apart from each other, wherein forming the first TIM film comprises placing a first pre-formed TIM sheet on an upper surface of the first die, wherein forming the second TIM film and the third TIM film comprises depositing a gel-type TIM material on the second die and the third die, wherein the first pre-formed TIM sheet and the gel-type TIM material are different materials;
    bonding a second side of the interposer to a first surface of a substrate; and
    attaching a heat-dissipation lid to the first surface of the substrate to form an enclosed space between the heat-dissipation lid and the substrate, wherein the first die, the second die, the third die, the first TIM film, the second TIM film, and the third TIM film are disposed in the enclosed space, wherein the first TIM film, the second TIM film, and the third TIM film contact the heat-dissipation lid.

2. The method of claim 1, wherein after placing the first pre-formed TIM sheet, in a top view, the first pre-formed TIM sheet has a geometric similar shape as the first die, and an area of the first pre-formed TIM sheet is larger than that of the first die; and
    wherein forming the first TIM film further comprises after placing the first pre-formed TIM sheet, pressing the first pre-formed TIM sheet on the upper surface of the first die by rolling a roller.

3. The method of claim 2, wherein forming the first TIM film further comprises:
    after placing the first pre-formed TIM sheet and before the pressing, placing a second pre-formed TIM sheet on the first pre-formed TIM sheet, wherein the first pre-formed TIM sheet and the second pre-formed TIM sheet are of a same size.

4. The method of claim 2, wherein rolling the roller comprises rolling the roller along a direction parallel to the upper surface of the first die.

5. The method of claim 2, wherein forming the second TIM film and the third TIM film further comprises:
    after depositing the gel-type TIM material, curing the gel-type TIM material, wherein the cured gel-type TIM material on the second die and the third die forms the second TIM film and the third TIM film, respectively.

6. The method of claim 5, wherein the second TIM film and the third TIM film are formed to be thicker than the first TIM film.

7. The method of claim 6, wherein the first pre-formed TIM sheet is a dielectric material, and the gel-type TIM material is an electrically conductive material.

8. The method of claim 7, wherein the dielectric material of the first pre-formed TIM sheet is a mixture of carbon and a polymer, and the electrically conductive material of the gel-type TIM material is a mixture of an adhesive and a metal filler.

9. The method of claim 6, wherein the heat-dissipation lid has a planar lower surface, wherein after attaching the heat-dissipation lid, the first TIM film, the second TIM film, and the third TIM film contact the planar lower surface of the heat-dissipation lid.

10. The method of claim 9, wherein after attaching the heat-dissipation lid, there are empty spaces between adjacent ones of the first TIM film, the second TIM film, and the third TIM film.

11. The method of claim 10, wherein the heat-dissipation lid is formed of an electrically conductive material, wherein attaching the heat-dissipation lid comprises electrically coupling the heat-dissipation lid to a conductive pad of the substrate, wherein the conductive pad is configured to be coupled to electrical ground.

12. A method of forming a semiconductor structure, the method comprising:
    attaching a first die, a second die, and a third die to a first surface of an interposer, wherein the first die is between the second die and the third die;
    forming a molding material on the interposer around the first die, the second die, and the third die;
    forming a first thermal interface material (TIM) film, a second TIM film, and a third TIM film on the first die, the second die, and the third die, respectively, wherein the first TIM film is a dielectric material, wherein the second TIM film and the third TIM film are an electrically conductive material, wherein forming the first TIM film comprises placing a pre-formed TIM sheet on the first die, wherein forming the second TIM film and the third TIM film comprises dispensing a gel-type TIM material on the second die and the third die;
    attaching a second surface of the interposer to a first side of a substrate; and
    attaching a heat-dissipation lid to the first side of the substrate, wherein the first die, the second die, the third die, the first TIM film, the second TIM film, and the third TIM film are disposed in an enclosed space between the heat-dissipation lid and the substrate, wherein the first TIM film, the second TIM film, and the third TIM film contact the heat-dissipation lid.

13. The method of claim 12, wherein the second TIM film and the third TIM film are formed to be thicker than the first TIM film.

14. The method of claim 13, wherein in a top view, the first TIM film is at a center region of the molding material, and the second TIM film and the third TIM film are at peripheral regions of the molding material.

15. The method of claim 12, wherein forming the second TIM film and the third TIM film further comprises:
    after the dispensing, curing the gel-type TIM material.

16. A method of forming a semiconductor structure, the method comprising:
    attaching a first die and a second die to a first surface of an interposer, wherein the first die is attached to a center region of the first surface of the interposer, wherein the second die is attached to a peripheral region of the first surface of the interposer, wherein the first die and the second die have a coplanar upper surface distal from the first surface of the interposer;

forming a molding material on the interposer around the first die and the second die;

forming a first thermal interface material (TIM) film and a second TIM film on the first die and the second die, respectively, wherein the first TIM film is formed of a first material, wherein the second TIM film is formed of a second material different from the first material, wherein the first TIM film and the second TIM film are formed to have different thicknesses;

bonding a second surface of the interposer to a first surface of a substrate; and attaching a heat-dissipation lid to the first surface of the substrate, wherein the first die, the second die, the first TIM film, and the second TIM film are disposed in an enclosed space between the heat-dissipation lid and the substrate, wherein the heat-dissipation lid has a flat lower surface facing the first die and the second die, wherein the first TIM film and the second TIM film contact the flat lower surface of the heat-dissipation lid.

17. The method of claim 16, wherein a second thickness of the second TIM film is larger than a first thickness of the first TIM film.

18. The method of claim 17, wherein the first TIM film is formed of a dielectric material, and the second TIM film is formed of an electrically conductive material.

19. The method of claim 16, wherein forming the first TIM film comprises:
  placing a pre-formed TIM sheet on the first die; and
  rolling a roller on the pre-formed TIM sheet; and
  wherein forming the second TIM film comprises:
    dispensing a gel-type TIM material on the second die; and
    after the dispensing, curing the gel-type TIM material.

20. The method of claim 16, wherein the heat-dissipation lid is formed of a metal material, wherein the method further comprises electrically coupling the heat-dissipation lid to a conductive pad of the substrate, wherein the conductive pad is configured to be connected to electrical ground.

* * * * *